(12) United States Patent
Faley et al.

(10) Patent No.: US 10,497,503 B2
(45) Date of Patent: Dec. 3, 2019

(54) SUPERCONDUCTING MAGNETIC FIELD STABILIZER

(71) Applicant: FORSCHUNGSZENTRUM JUELICH GMBH, Juelich (DE)

(72) Inventors: Mikhail Faley, Juelich (DE); Ulrich Poppe, Dueren (DE)

(73) Assignee: Forschungszentrum Juelich GmbH (DE)

( * ) Notice: Subject to any disclaimer, the term of this patent is extended or adjusted under 35 U.S.C. 154(b) by 243 days.

(21) Appl. No.: 15/122,754

(22) PCT Filed: Nov. 12, 2014

(86) PCT No.: PCT/DE2014/000580
§ 371 (c)(1),
(2) Date: Aug. 31, 2016

(87) PCT Pub. No.: WO2015/135513
PCT Pub. Date: Sep. 17, 2015

(65) Prior Publication Data
US 2017/0069415 A1 Mar. 9, 2017

(30) Foreign Application Priority Data
Mar. 13, 2014 (DE) .................. 10 2014 003 536

(51) Int. Cl.
H01F 1/00 (2006.01)
H01F 7/20 (2006.01)
(Continued)

(52) U.S. Cl.
CPC ............. H01F 7/20 (2013.01); G01R 33/389 (2013.01); H01F 6/06 (2013.01); H01J 29/56 (2013.01); H01J 37/141 (2013.01)

(58) Field of Classification Search
CPC .... H01F 7/20; H01F 6/06; H01J 29/56; H01J 137/141; G01R 33/389
(Continued)

(56) References Cited

U.S. PATENT DOCUMENTS 3,234,435 A    2/1966  Hempstead et al.
3,868,522 A *  2/1975  Bigham ............. H05H 13/00
                                                313/62
(Continued)

FOREIGN PATENT DOCUMENTS

EP    0 257 371    8/1987
EP    0 730 284    9/1996
(Continued)

OTHER PUBLICATIONS

Mikhail Faley, et al., (U.S. National Stage of PCT/DE2014/000580 Filed Nov. 12, 2014) Aug. 31, 2016 for Superconducting Magnetic Field Stabilizer.
(Continued)

Primary Examiner — Shawki S Ismail
Assistant Examiner — Lisa N Homza
(74) Attorney, Agent, or Firm — Jordan and Koda, PLLC

(57) ABSTRACT

A device for applying a constant magnetic field to a volume of interest (VOI) has been developed. At least one magnetic field source and a permeable yoke, which guides the magnetic flux generated by this magnetic field source into the volume of interest (VOI). The yoke is guided through at least one closed conductor loop, which can be switched to the superconducting state so that, in the superconducting state of the conductor loop, a change in the flux through the yoke effects a current counteracting this change along the conductor loop. It has been identified that, in this way, the stabilizer for the magnetic field can be spaced so far apart from the volume of interest (VOI) that the field distribution
(Continued)

in this volume is virtually no longer influenced. At the same time, the quality of the stabilization is also improved, since the conductor loop is no longer exposed to the entire magnetic field prevailing in the volume of interest (VOI). The entire critical current that the conductor loop can carry is available as a control range for compensating for fluctuations in the flux. In comparison with the prior art, the invention first accepts the apparent disadvantage that, in general, additional means are required for switching the conductor loop back and forth between the superconducting state and the normal-conducting state. However, this disadvantage is more than compensated for.

29 Claims, 11 Drawing Sheets

(51) Int. Cl.
  *G01R 33/389* (2006.01)
  *H01F 6/06* (2006.01)
  *H01J 29/56* (2006.01)
  *H01J 37/141* (2006.01)

(58) Field of Classification Search
  USPC .......................................................... 335/296
  See application file for complete search history.

(56) References Cited

U.S. PATENT DOCUMENTS

| | | | | |
|---|---|---|---|---|
| 3,925,676 A * | 12/1975 | Bigham | ............. | A61N 5/10 313/62 |
| 4,641,057 A * | 2/1987 | Blosser | ............. | H05H 7/20 313/62 |
| 4,641,104 A * | 2/1987 | Blosser | ............. | H05H 7/20 250/493.1 |
| 4,771,208 A * | 9/1988 | Jongen | ............. | H05H 13/00 313/62 |
| 4,965,248 A * | 10/1990 | Poppe | ............. | C23C 14/087 204/192.24 |
| 5,329,266 A | 7/1994 | Soeldner et al. | | |
| 5,448,213 A | 9/1995 | Kalsi | | |
| 5,463,291 A * | 10/1995 | Carroll | ............. | H05H 7/04 29/602.1 |
| 5,521,469 A * | 5/1996 | Laisne | ............. | H05H 13/00 315/502 |
| 5,534,779 A | 7/1996 | Young et al. | | |
| 6,057,655 A * | 5/2000 | Jongen | ............. | H05H 7/10 313/359.1 |
| 6,576,916 B2 * | 6/2003 | Smith | ............. | G21F 5/10 250/493.1 |
| 6,683,426 B1 * | 1/2004 | Kleeven | ............. | H05H 7/10 315/500 |
| 7,456,591 B2 * | 11/2008 | Jongen | ............. | H05H 7/08 313/62 |
| 7,541,905 B2 * | 6/2009 | Antaya | ............. | H05H 7/04 313/62 |
| 7,656,258 B1 * | 2/2010 | Antaya | ............. | H01F 6/00 313/62 |
| 8,525,448 B2 * | 9/2013 | Tanaka | ............. | H05H 7/12 250/396 R |
| 8,581,523 B2 * | 11/2013 | Gall | ............. | H05H 13/02 315/501 |
| 8,581,525 B2 * | 11/2013 | Antaya | ............. | H05H 13/005 315/500 |
| 8,791,656 B1 * | 7/2014 | Zwart | ............. | H05H 7/04 315/503 |
| 8,836,205 B2 * | 9/2014 | Hashimoto | ............. | H05H 13/005 313/47 |
| 8,927,950 B2 * | 1/2015 | Gall | ............. | A61N 5/1077 250/492.1 |
| 8,947,184 B2 * | 2/2015 | Jongen | ............. | H05H 13/005 313/62 |
| 8,952,634 B2 * | 2/2015 | Sliski | ............. | H05H 13/02 315/503 |
| 9,155,186 B2 * | 10/2015 | Zwart | ............. | H05H 7/04 |
| 9,545,528 B2 * | 1/2017 | Gall | ............. | H05H 13/02 |
| 9,622,334 B2 * | 4/2017 | Hashimoto | ............. | H05H 13/005 |
| 9,622,335 B2 * | 4/2017 | Gall | ............. | H05H 7/04 |
| 9,661,736 B2 * | 5/2017 | O'Neal, III | ............. | H05H 13/04 |
| 9,730,308 B2 * | 8/2017 | Zwart | ............. | A61N 5/1077 |
| 9,962,560 B2 * | 5/2018 | Zwart | ............. | A61N 5/1043 |
| 2008/0093567 A1 * | 4/2008 | Gall | ............. | A61N 5/1081 250/493.1 |
| 2014/0094371 A1 * | 4/2014 | Zwart | ............. | H05H 13/02 505/180 |

FOREIGN PATENT DOCUMENTS

| | | |
|---|---|---|
| EP | 0 819 948 | 1/1998 |
| JP | 63274116 A | 11/1988 |
| JP | 63289906 A | 11/1988 |
| JP | 63-299211 A | 12/1988 |
| JP | 63306506 A | 12/1988 |
| JP | 64-22008 A | 1/1989 |
| JP | 6411308 A | 1/1989 |
| JP | 6450349 A | 2/1989 |
| JP | 01125807 A | 5/1989 |
| JP | 2001196219 A | 7/2001 |
| WO | WO-2012/137245 | 10/2012 |

OTHER PUBLICATIONS

U.S. National Stage of PCT/DE2014/000580, Filed Nov. 12, 2014.

* cited by examiner

FIG. 10(A)
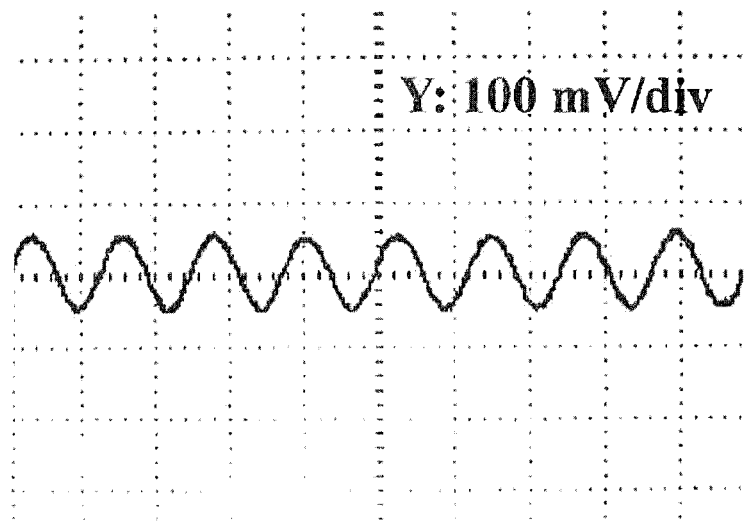
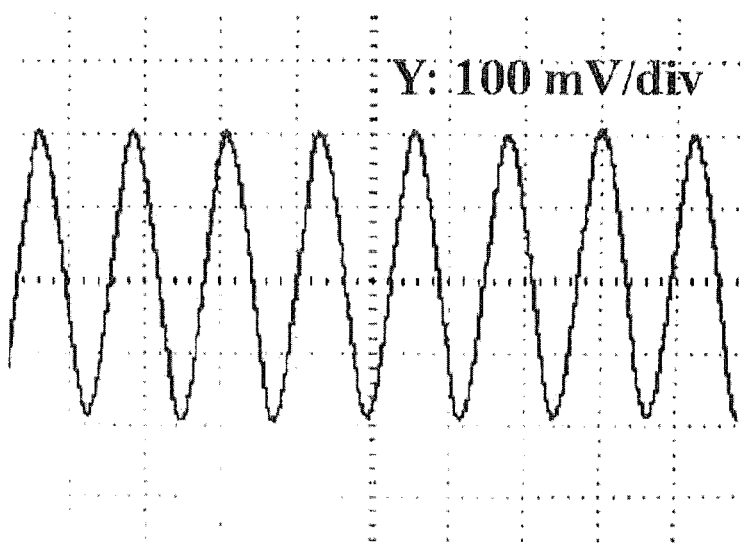
FIG. 10(B)

SUPERCONDUCTING MAGNETIC FIELD STABILIZER

The invention relates to a device for applying a constant magnetic field to a volume of interest (VOI), and to a method for the operation thereof.

BACKGROUND OF THE INVENTION

In many applications, for example in electron microscopes, a strong, although temporally extremely constant, magnetic field is applied to a bounded volume of interest (VOI). Since correspondingly strong magnetic field sources take up a large amount of space, which is usually unavailable at the location of the volume of interest (VOI), a magnetic flux is coupled into a magnetically permeable yoke by means of the magnetic field source and is guided through this yoke into the volume of interest (VOI). This volume of interest is usually implemented as a gap between regions of the yoke that are designed as pole shoes. The area in which the yoke is not designed as a pole shoe usually has the form of a torus.

Different interferences set limits on the temporal constancy of the magnetic field in the volume of interest (VOI) that can be achieved in this case. If a current-carrying coil is used as the magnetic field source, for example, the temporal constancy is limited from the outset by the constancy of the current source used for the current I. In this case, a relative accuracy $\Delta I/I$ only in the range $10^{-7}$ to $10^{-8}$ is achievable with a justifiable amount of effort. The yoke also functions, disadvantageously, as an antenna, which attracts the field lines of interference fields that are electromagnetic or are generated by moving magnetic objects and guides the field lines, together with the intended field, into the volume of interest (VOI). In addition, statistical fluctuations (Barkhausen noise) are impressed upon the magnetic flux transmitted through the yoke as a result of flux jumps in the permeable (magnetically soft) material. Since the permeability of the yoke is temperature-dependent, temperature fluctuations are likewise disadvantageously converted into fluctuations of the magnetic field in the volume of interest (VOI).

A superconducting ring topology, which is disposed within the volume of interest (VOI), for stabilizing the magnetic field is known from U.S. Pat. No. 3,234,435. Disadvantageously, the magnetic field distribution in the volume of interest (VOI) is greatly changed by the ring topology.

In addition, flux tubes move in the ring topology, since the pinning of the flux tubes in strong magnetic fields has only limited effectiveness. This results in further fluctuations of the magnetic field in the VOI.

The object of the invention is, therefore, to provide a device with which the magnetic field in the volume of interest (VOI) can be stabilized without influencing the field distribution.

These objects are achieved according to the invention by a device and by a method for the operation thereof.

SUMMARY OF THE INVENTION

Within the scope of the invention, a device for applying a constant magnetic field to a volume of interest (VOI) has been developed. This device comprises at least one magnetic field source and a permeable, preferably magnetically soft, yoke, which guides the magnetic flux generated by this magnetic field source into the volume of interest (VOI).

The magnetic field source in this case can be, in particular, a normally conductive or superconducting coil and a permanent magnet or a superconducting solid body having a frozen-in magnetic flux.

According to the invention, the yoke is guided through at least one closed conductor loop, which can be switched to the superconducting state so that, in the superconducting state of the conductor loop, a change in the flux through the yoke effects a current counteracting this change along the conductor loop. The magnetic flux, which passes through the interior of the conductor loop, remains constant for as long as the superconductivity is maintained.

Within the meaning of this invention, "closed" means that a continuous supercurrent can be induced along the conductor loop by a change in the magnetic flux, which passes through the interior of the conductor loop. Any topologically closed shape, i.e., any shape that can be produced by continuously deforming a ring having at least one hole, meets this condition.

It has been identified that, in this way, the stabilizer for the magnetic field can be spaced so far apart from the volume of interest (VOI) that the field distribution in this volume is practically no longer influenced (negligibly or only to a very low extent). At the same time, the quality of the stabilization is also improved, since the conductor loop is no longer exposed to the entire magnetic field prevailing in the volume of interest (VOI): If the conductor loop is in the normal-conducting state while the flux through the yoke is adjusted by means of the magnetic field source (e.g., coil around the yoke or permanent magnet), and if the conductor loop is only then switched to the superconducting state, a supercurrent initially does not flow in the conductor loop. Only when undesirable interferences change the flux through the yoke does this effect a supercurrent along the conductor loop, which counteracts this change. These interferences make up only a very small fraction (typically approximately $10^{-7}$ to $10^{-8}$ in higher-quality electron microscopes) of the flux that is guided through the yoke to the volume of interest (VOI) and is captured therein at the location of the conductor loop. The relatively low shield currents induce only low mechanical forces in the conductor loop, and flux jumps and migrations of flux tubes are minimized by non-ideal pinning.

The entire critical current that the conductor loop can carry is available as a control range for compensating for fluctuations in the flux. In the device according to the prior art, however, the stabilizer is constantly located in a strong field, and therefore a substantially narrower control range is available, which becomes increasingly narrower as the field strength increases. According to the prior art, the value of the field strength to be held constant is adjusted by way of intentionally exceeding this control range by increasing the field strength applied from the outside.

This is important, in particular, when interferences occur in the flux through the yoke that non-statistically fluctuate around 0. Interferences having a positive sign increase the supercurrent through the conductor loop, whereas interferences having a negative sign decrease the supercurrent. Therefore, interferences that statistically fluctuate around 0 eventually disappear over the course of time, and thus, on balance, supercurrent does not accumulate in the conductor loop. If there is a continuous interference, however, which does not change its sign (for example, a drift in the power pack that supplies the magnetic field-generating coil with current), such a supercurrent accumulates. The interference then remains in the volume of interest (VOI), without influencing the magnetic field, only until the critical current through the conductor loop has been achieved.

If the conductor loop in the device according to the invention is already in the superconducting state when the flux is adjusted by means of the magnetic field source, this change in flux is not immediately manifested in the volume of interest (VOI), but rather is temporarily stored, as it were, in the supercurrent generated in the conductor loop. Only when the conductor loop is switched to the normal-conducting state, at least briefly, at least one point, is the supercurrent converted into a change in the magnetic field in the volume of interest (VOI). In this way, a change in the flux generated by the magnetic field source can be converted into a change in the magnetic field strength in the volume of interest (VOI). If the conductor loop is then returned to the superconducting state, the field in the volume of interest (VOI) is held constant at the new level.

In order to enable the magnetic field in the VOI to be changed rapidly, it is advantageous to design the superconducting conductor loop as a thin film on thin substrate or form it from a commercial, superconducting strip conductor (e.g., Hastelloy having a high-temperature superconducting (HTSL) coating). A reduction in the cross-sectional area (flux dam), through which a magnetic flux can pass in the normal-conducting state, and/or local thin-layer heating can be implemented locally on the superconducting thin film. The conductor loop can then be switched, at least locally, between the superconducting and the normal-conducting state with time constants down to the millisecond range. Therefore, the main field in the volume of interest (VOI) can be changed quasi-continuously when this is necessary for the specific application. A preferably continuous field change is highly desirable, for example, when adjusting the focus in an electron microscope having electromagnetic lenses.

In light of that described above, the invention also relates to a method for operating the device according to the invention, in which either the magnetic field in the VOI is adjusted while the conductor loop is in the normal-conducting state, or the field change is initially converted into a supercurrent through the conductor loop and is subsequently transferred into the VOI by switching the conductor loop into the normal-conducting state.

In comparison with the prior art, the invention first accepts the apparent disadvantage that, in general, additional means are required for switching the conductor loop back and forth between the superconducting state and the normal-conducting state. However, this disadvantage is more than compensated for, in that:
the field distribution in the volume of interest (VOI) is no longer influenced;
substantially greater fluctuations in the flux through the yoke can be easily compensated for; and
the usable field strength in the volume of interest (VOI) is no longer limited by the critical field strength of the superconducting material used for the conductor loop.

If the conductor loop is switched from the normal-conducting state to the superconducting state by cooling to below the transition temperature, the magnetic field source and the yoke can also be advantageously cooled, in particular using the same cooling medium and to the same temperature. This is not only particularly technically easily implemented, it also simultaneously reduces the thermal and magnetic noise both in the magnetic field source and in the yoke. In addition, a superconducting coil or a superconducting solid body having a frozen-in magnetic flux can be used, advantageously, in this case (corresponds to a superconducting permanent magnet that was generated by a superconducting continuous current).

Alternatively, it is possible to cool only the conductor loop. In that case, a thermal mass to be cooled is smaller, which takes less time, and neither the yoke nor the magnetic field source are subjected to thermal cycles. The conductor loop is then advantageously thermally insulated both with respect to the yoke and with respect to the magnetic field source.

Advantageously, the conductor loop is disposed along the yoke between the location at which undesirable fluctuations are predominantly impressed upon the flux through the yoke, and the volume of interest (VOI). If fluctuations, for example, in the strength of the magnetic field source, which are due to a limited relative constancy of the power supply, for example, are the limiting factor for the relative constancy of the magnetic field in the volume of interest (VOI), one conductor loop is sufficient, which is disposed at any point between the magnetic field source and the VOI. The conductor loop should then be disposed along the yoke at a distance from the magnetic field source such that cross couplings are largely avoided. Advantageously, the conductor loop is therefore disposed at a location at which the magnetic field emanating from the magnetic field source has at most one-tenth, preferably at most one one-hundredth and, very particularly preferably, at most one one-thousandth of its maximum field strength.

However, if fluctuations in the magnetic field in the VOI originate mainly from interferences that arise in the yoke itself (Barkhausen noise) or are captured by the yoke, a conductor loop should be disposed in the area of any transition between the volume of interest (VOI) and the yoke, in particular anywhere that the yoke transitions into a region designed as a pole shoe (due to a reduction of its cross-sectional area, for example).

However, the conductor loop can also surround a permeable, in particular magnetically soft, element added to the region that is designed as a pole shoe and that is separated from the pole shoe by a gap. The magnetic flux then flows from the pole shoe, over the gap, and into the additional element. This design makes it possible to cool the conductor loop together with the additional element, without this affecting the existing pole shoe. The additional element can be designed, in particular, as a flux concentrator, which focuses the magnetic flux from the pole shoe into a spatially narrowly limited magnetic field distribution in the VOI.

Advantageously, the yoke is guided through at least one conductor loop on every path leading from a magnetic field source to the volume of interest (VOI). Interferences of the flux, which are coupled into the yoke on all these paths, then no longer act on the volume of interest (VOI), but rather are converted into corresponding supercurrents through the conductor loops.

Further conductor loops tend to increase the available control range within which interferences in the flux are compensated for. For example, conductor loops that require a relatively large amount of space and can therefore carry a high critical current can be disposed in the vicinity of the magnetic field source, and therefore the conductor loops are capable of compensating for large interferences from the power pack of the magnetic field source. Smaller conductor loops, which are acted upon only by the interferences that originate in the yoke itself, or that are captured by the yoke, can then be disposed in the vicinity of the volume of interest (VOI), where substantially less space is available.

Advantageously, at least one conductor loop is disposed at a location along the yoke at which the leakage field strength emanating from the yoke amounts to at most one-fifth, preferably at most one-tenth and, very particularly preferably, at most one one-hundredth of the maximum magnetic field strength in the volume of interest (VOI). It is then ensured that the conductor loop has particularly little influence on the field distribution in the volume of interest (VOI). This is advantageous, in particular, for electron optical systems, such as electron microscopes.

Advantageously, the material of the yoke has a relative permeability $\mu_r$ of at least 10, preferably of at least 100. The relative permeability pr is a dimensionless parameter. In the particular system of units selected, the relative permeability indicates the amount by which the permeability is greater than that of a vacuum. The greater the relative permeability is, the greater the flux $\Phi$ is that emanates from the magnetic field source, the greater the portion of this flux is that is coupled into the yoke, and the lesser the amount of this flux is that is lost in the form of leakage fields ahead of the volume of interest (VOI). The magnetic flux in the yoke is $\Phi = B*S = \mu_r*\mu_0*H_{Feld}*S$, wherein B is the magnetic flux density, $H_{Feld}$ is the local magnetic field strength, S is the local cross-sectional area of the yoke, and $\mu_0 = 4*\pi*10^{-7}$ H/m is the magnetic permeability of the vacuum. The unit $\mu_0$ can be expressed in different SI units: $[\mu_0] = H/m = N/A^2 = V*s/(A*m) = T*m/A = T^2*m^3/J = kg*m/C^2 = kg*m/(A^2*s^2)$, where the units used are: H—henry, m—meter, V—volt, s—second, A—ampere, T—tesla, J—joule, N—newton, kg—kilogram, C—coulomb.

The yoke does not need to be produced as a single piece, nor does it need to consist entirely of the same material. When the yoke consists of multiple parts, the magnetic flux can pass from one part into the other part, for example over a gap between parallel surfaces of the parts. For example, in a TEM, the yoke can comprise parts of the objective lens as well as parts of the specimen holder.

For example, the yoke can have a high saturation magnetization in the vicinity of the magnetic field source and, therefore, can have an only moderately high relative permeability $\mu_r$. In the vicinity of the VOI, however, where the magnetic flux through the yoke has already decreased due to the distance to the magnetic field source and the interruption of the yoke for the purpose of forming the VOI, the yoke can have a very high relative permeability $\mu_r$ of up to 100,000 in exchange for a slightly lower saturation magnetization. A high saturation magnetization, on the one hand, and a high relative permeability $\mu_r$, on the other hand, are often opposite effects.

Particularly advantageously, the yoke can have, at least in subregions, a bore extending in the direction of the magnetic field, through which a light or particle beam, in particular an electron beam, can be directed into the volume of interest (VOI) in the direction of the magnetic field. In this case, the local inhomogeneous leakage field acts, at the outlet of the bore, as an electromagnetic lens for the electron beam.

In a particularly advantageous embodiment of the invention, switching means are provided for the local switching of one part of at least one conductor loop from the superconducting state to the normal-conducting state. As a result, the topologically closed supercurrent can be interrupted, and therefore a magnetic flux can penetrate the interior of the conductor loop. In general, such a switching can be implemented substantially faster than a complete warming-up or cooling-down of the conductor loop past the transition temperature. The switching means advantageously comprise:
  at least one Josephson contact, optionally multiple Josephson contacts (such as a SQUID structure); and/or
  a heating element; and/or
  an electromagnetic radiation source for the local heating of the conductor loop; and/or
  a local reduction of cross-sectional area of the conductor, which has a reduced critical current on the periphery of the conductor loop, through which a magnetic flux can penetrate the conductor loop (flux dam) during the transition to the normal-conducting state.

A Josephson contact can be switched particularly rapidly between the normal-conducting state and the superconducting state purely electromagnetically (thermally, magnetically, using microwaves, light, etc.). A radiation source for the local warming can be a laser, in particular.

When the switching means comprise a Josephson contact, the flux in the conductor loop can be specifically adjusted. With the aid of a SQUID as the detector, it is possible to count the penetrating flux quanta. The magnetic field in the volume of interest (VOI) can then be measured down to a very small ($10^{-6}$) fraction of a flux quantum $\Phi_0$ and can be adjusted via a correction coil by means of feedback.

Advantageously, at least one conductor loop is implemented as a layer on a substrate, which either does not switch to the superconducting state at all, or only switches to the superconducting state at a transition temperature that is lower than that of the layer. This substrate can be thermally conductive, in particular, and it can contain means for cooling to below the transition temperature of the layer. A layer can be cooled and re-heated substantially more rapidly than a solid conductor loop. The particularly preferred high temperature superconductors, in particular ceramic, high temperature superconductors based on $YBa_2Cu_3O_{7-x}$ (YBCO), are also very brittle. A layer on a suitable, stabilizing substrate can be more durable than solid YBCO material.

For the rest, the basic functioning of the device is not dependent on any certain geometric shape of the conductor loop, on any certain shape of its cross section, or on any certain superconducting material. The conductor loop can have any type of closed shape that surrounds the yoke. It can be a ring, in particular, such as a flat circular ring, or a torus. It can also be a coil, however, the beginning and end of which are connected in a superconducting manner, and therefore continuous current can flow. The material of the conductor loop is, advantageously, a type II superconductor having a high critical magnetic field and good flux pinning. Preferably it is a high temperature superconductor (HTSL).

Advantageously, the magnetic field source, the yoke, and at least one conductor loop are designed with rotational symmetry about an axis that passes through the volume of interest (VOI). Advantageously, this axis passes through the volume of interest in the direction of the magnetic field guided into this volume. A likewise rotationally symmetrical field forms in the volume of interest (VOI), which can be used, in particular, for electron optical systems such as electron microscopes.

The main physical mechanism that is decisive for the stabilization of the field strength in the volume of interest (VOI) is the Meissner-Ochsenfeld effect. Every change in the magnetic flux through the yoke represents an attempt to apply a magnetic field to the interior of the superconducting conductor loop. Given that such a field is displaced from the interior, the supercurrent through the conductor loop forms, and this supercurrent counteracts the change in flux. As another result of the superconducting conductor loop, however, the flux that is passing through the conductor loop is quantized as an integral number of flux quanta and can only be changed by such an integral number in each case. The fluxes that are used in electron microscopes in the usual imaging mode are so high that this will not be conspicuous in the generated images, in the normal case. Using test measurements directed specifically thereto, the quantization can, however, be graphically represented. In addition, the quantization can be specifically utilized in experiments with quantum systems. Quantization can also be utilized, for example, in holographic experiments with electron beams in the electron microscope for analyzing magnetic specimens.

Advantageously, at least one correction coil, to which a current can be applied separately, is disposed along the yoke, between the conductor loop and the volume of interest. Such a correction coil can noticeably change its focus even with a magnetic field that has only approximately 0.1% of the strength of the main field. The correction coil can consist of a normal conductor or—if it is cooled—of a superconductor.

Advantageously, means for measuring a magnetic field strength emanating from a correction coil, and a feedback loop are provided, wherein the feedback loop receives the measured field strength as an input and regulates the current through the correction coil. The sensor for this measurement can be a SQUID, in particular. In general, no additional effort is required for the cooling thereof, since the cooling for the conductor loop can also be utilized for this purpose. The feedback control can take place, in particular, with respect to a maximum constancy of the measured field strength.

In one further particularly advantageous embodiment of the invention, the yoke is guided through at least two conductor loops, which are disposed along the yoke at a distance from one another that corresponds to at most the width thereof. The distance is then at least as great as the shortest distance, i.e., the minimum gap width between the conductor loop and the yoke. In a further particularly advantageous embodiment of the invention, the conductor loop is at least as thick as it is wide. In one further advantageous embodiment of the invention, the yoke has a bulge, which:

rests on the area defined by the course of the conductor loop in space; and/or is separated from this area by a gap, wherein the bulge extends into the region in which the magnetic field generated by the conductor loop has at least 50% of its maximum strength on the area.

As a result of these embodiments, the compensation field of the conductor loop, or the conductor loops, generated by the supercurrent is homogenized across the cross section of the area surrounded by each conductor loop. The magnetic flux generated by this field then passes through a larger portion of the yoke and contributes to the compensation for changes in flux in the yoke. The portion of the magnetic flux that emanates from a supercurrent through the conductor loop and extends through the gap between the conductor loop and the yoke is unavailable for the compensation. If the conductor loop is a thin layer and, the gap between the conductor loop and the yoke is also large, this portion can amount to up to one-third of the total flux passing through the conductor loop.

In light that described above, the invention also relates to a use of the device according to the invention:

as a magnetic dipole or multipole lens in an electron microscope;

for stabilizing a magnetic field, which is applied to a specimen during a measurement of nuclear magnetic resonance (NMR);

for stabilizing a magnetic field in a particle trap, in particular in an ion trap, a trap for Bose-Einstein condensates, or a trap for other elementary particles; or for stabilizing the magnetic field of a beam-guiding or detect or magnet in a particle accelerator, in particular for the purpose of analyzing and/or forming a particle beam.

SPECIFIC DESCRIPTION

The subject matter of the invention is described in the following with reference to figures, without the subject matter of the invention being limited thereby.

BRIEF DESCRIPTION OF THE DRAWINGS

FIG. 10(A) shows oscilloscope recordings of the proof-of-concept measurement for the conductor loop is in the superconducting state;

FIG. 10(B) shows oscilloscope recordings of the proof-of-concept measurement for the conductor loop in the normal-conducting state;

DESCRIPTION OF THE PREFERRED EMBODIMENTS

Figure 1:
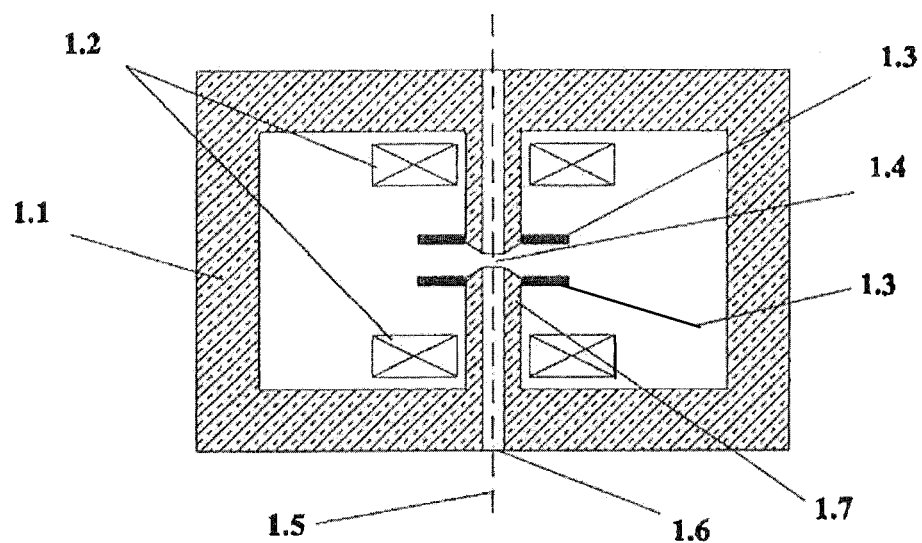
FIG. 1: shows a sectional drawing of a magnetic lens for an electron microscope.

FIG. 1 shows a sectional drawing of a magnetic lens for an electron microscope as one exemplary embodiment of the device according to the invention. The lens can be used in the electron microscope, for example, as an objective lens, a correcting lens, or a condenser lens. A magnetic flux, which is generated by normal-conducting or superconducting coils 1.2 as the magnetic field source, is guided through a magnetically soft yoke 1.1 into the volume of interest (VOI) 1.4, which acts as an electron beam lens. The specimen, which is imaged by the electron beam, is located in the vicinity of this volume during operation of the electron microscope. The electron beam can be guided along the symmetry axis 1.5 through the bore 1.6, which extends through the yoke in the direction of the magnetic field, into the volume of interest (VOI). This exemplary embodiment is rotationally symmetrical about the symmetry axis 1.5.

The superconducting conductor loop 1.3 provided according to the invention surrounds the part 1.7 of the yoke 1.1. At this location, the conductor loop 1.3 and the normal-conducting or superconducting coils 1.2 influence one another only slightly (negligibly). At the same time, the conductor loop 1.3 is also still located outside the magnetic leakage field, which forms in the frontmost region of the part 1.7 of the yoke. This frontmost region is designed, proceeding from a toroidal shape, as a pole shoe and, for this purpose, extends through a conical reduction of cross-sectional area and toward the volume of interest (VOI) 1.4.

Figure 2:
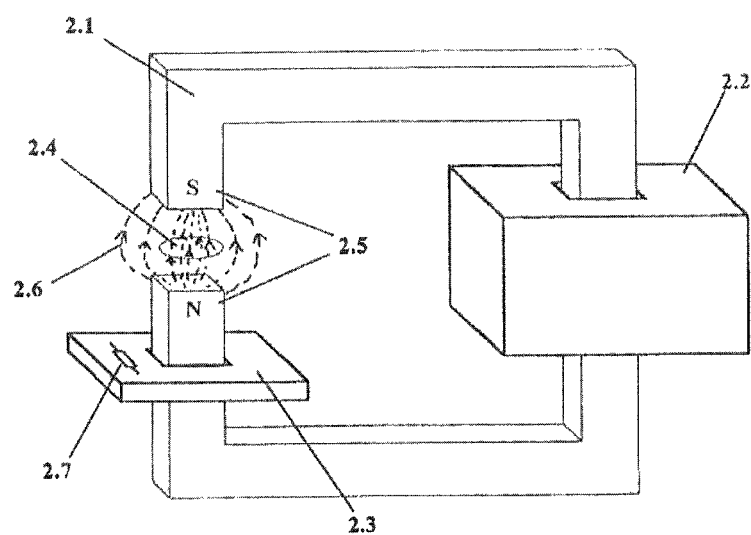
FIG. 2: shows a perspective view of one exemplary embodiment of the device according to the invention.

FIG. 2 shows a perspective view of a further exemplary embodiment of the device according to the invention. The magnetically soft yoke 2.1 has a shape, which has been bent to form a rectangle. A magnetic flux is coupled into this yoke 2.1 by a normal-conducting coil 2.2 as the magnetic field source. The yoke 2.1 guides this flux into the volume of interest (VOI) 2.4. This volume VOI was formed by way of the yoke 2.1 being interrupted by a gap. The magnetic flux Φ generated by a coil 2.2 is guided through the yoke 2.1 to the edges of the gap, which are defined by the pole shoes 2.5. The pole shoes form a magnetic north pole (N) and a magnetic south pole (S). The magnetic flux applies a magnetic field to the volume VOI 2.4. Some of the field lines 2.6 of this field are shown extending into the VOI 2.4, for purposes of illustration.

The strength of the magnetic field in the VOI 2.4 is determined by the magnetic flux through the yoke 2.1. The yoke 2.1 is surrounded by the superconducting conductor loop 2.3 in the vicinity of the pole shoe 2.5 that forms the north pole. After the magnetic field in the volume of interest VOI 2.4 has been adjusted by means of the normal-conducting coil 2.2, this conductor loop 2.3 is cooled to below its transition temperature and, therefore, is switched to the superconducting state. Changes in the magnetic flux 2.6 through the yoke 2.1 are henceforth compensated for by inducing a supercurrent along the conductor loop 2.3. A heating element 2.7 is located on the superconducting conductor loop. This makes it possible to switch the conductor loop back to the normal-conducting state, in order to implement a change in the magnetic field in the VOI 2.4 as necessary.

Figure 3:
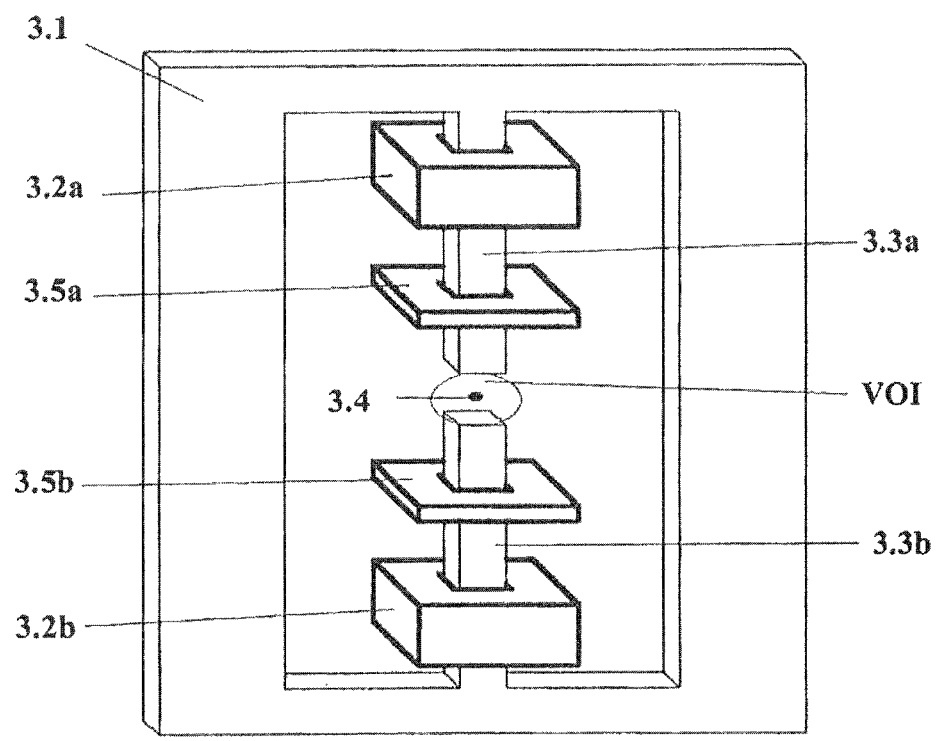
FIG. 3: shows a perspective view of one exemplary embodiment having two magnetic field sources and two superconducting conductor loops.

FIG. 3 shows a perspective view of a further exemplary embodiment of the device according to the invention. A magnetic flux is coupled into the magnetically soft yoke 3.1 by two normal-conducting coils 3.2*a* and 3.2*b* and is guided to the volume of interest (VOI). The VOI is located in a gap, whereby the yoke 3.1 is interrupted. The transitions of the yoke 3.1 to this gap are each in the form of pole shoes 3.3*a* and 3.3*b*, which act on the VOI as a magnetic north and south pole, respectively.

The yoke 3.1 is guided through the superconducting rings 3.5*a* and 3.5*b* in the vicinity of the pole shoes 3.3*a* and 3.3*b*. Each of these rings is implemented as a thin, superconducting layer on a toroidal, non-superconducting substrate. Independently of the point at which interferences are impressed on the magnetic flux through the yoke 3.1, these interferences are converted into supercurrents, which compensate for changes in flux, through the rings 3.5*a* and 3.5*b*, and therefore the flux through the yoke 3.1, and thus also the field in the VOI, remain virtually constant. A specimen 3.4 can be disposed in the center between the pole shoes.

Figure 4:
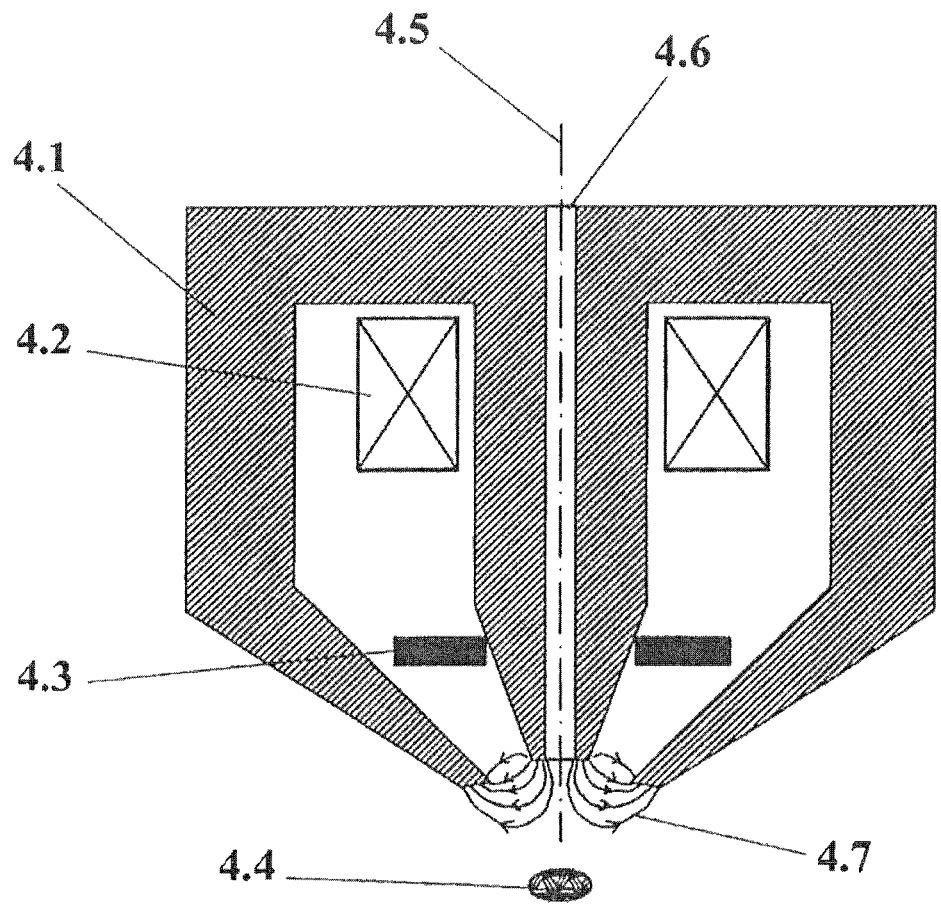
FIG. 4: shows a sectional drawing of a lens for an electron microscope, which tapers toward the volume of interest (VOI)

FIG. 4 shows a sectional drawing of a further rotationally symmetrical lens for an electron microscope as one exemplary embodiment of the device according to the invention. A coil 4.2 couples a magnetic flux into the magnetically soft yoke 4.1. This yoke tapers toward the volume of interest (VOI) 4.7. The volume of interest (VOI) 4.7 acts as a lens for the electron beam. The electron beam, when passing through the VOI 4.7 which acts as a lens, is focused onto a specimen 4.4, which is disposed at a working distance from the lens. The middle part of the yoke is guided through a superconducting conductor loop 4.3 at the point where the yoke begins to taper. This is a superconducting, closed coil or an annular thin layer on a coolable substrate. The lens is rotationally symmetrical about an axis 4.5, which extends through a bore 4.6 in the lens, in the direction of the main magnetic field, to the VOI.

Figure 5:
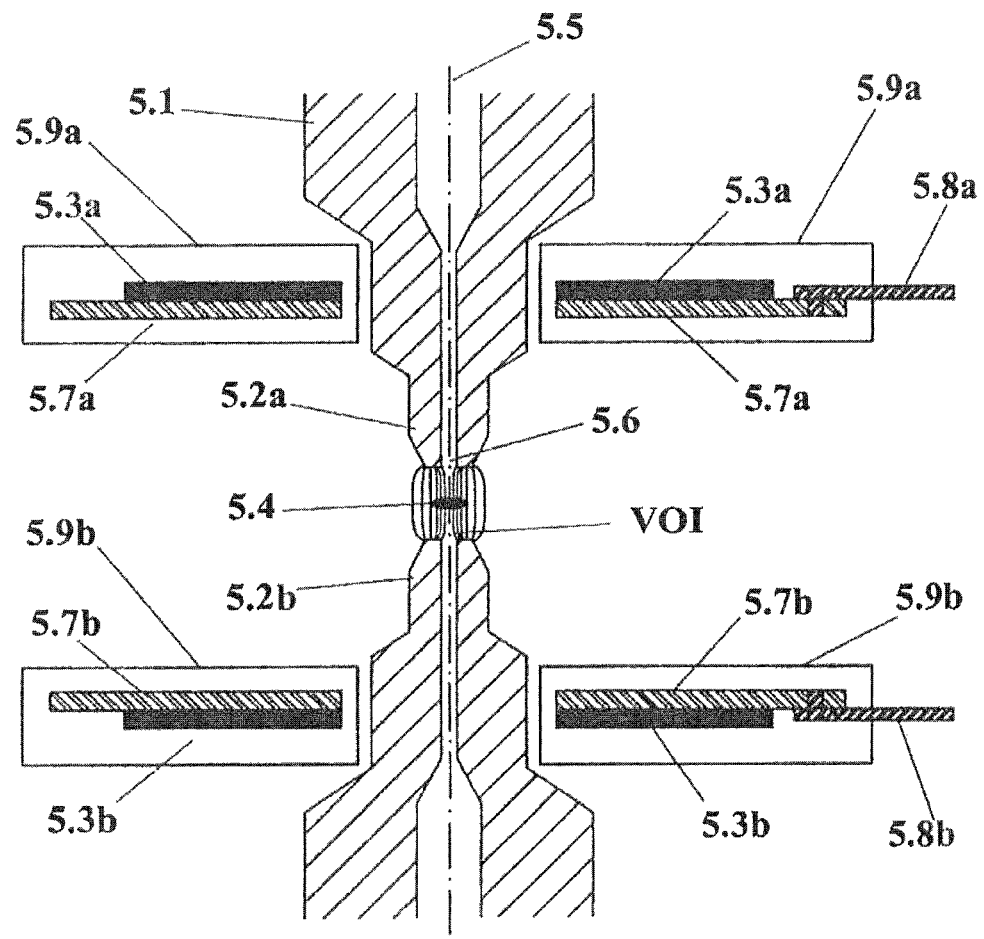
FIG. 5: shows a sectional drawing of a magnetic lens for a transmission electron microscope.

FIG. 5 shows a sectional drawing of a lens for a transmission electron microscope as one exemplary embodiment of the device according to the invention. The lens can be used, in particular, as an objective lens. The part of the magnetically soft yoke 5.1 through which a magnetic field source having a magnetic flux passes is not shown in FIG. 5, (e.g., see magnetic field source 1.2 in FIG. 1, magnetic field source 2.2. in FIG. 2, magnetic field source 3.2*a,b* in FIG. 3, magnetic field source 4.2 in FIG. 4). All that is shown is the part of the yoke 5.1 in which this yoke transitions, by conically tapering, into pole shoes 5.2*a* and 5.2*b*, which bound the volume of interest VOI. The two pole shoes 5.2*a* and 5.2*b* are each provided with a bore 5.6, through which the electron beam can be guided into the VOI, to the specimen 5.4 and, from there, to the detector, which is not shown in FIG. 5. An inhomogeneous magnetic field prevails between the pole shoes 5.2*a* and 5.2*b*, which acts as a lens in the immediate vicinity of the emergence from the bore 5.6; a few of the field lines are shown for purposes of illustration. The lens effect arises due to the strong curvature of the field lines in the region of the bore 5.6. This region is the volume of interest (VOI), because the imaging quality of the lens depends on how well the magnetic field is stabilized precisely here with respect to temporal and spatial fluctuations and its strength as well as its geometry. In particular, the strong curvature of the field lines, which is acting as a lens, must be retained.

The specimen 5.4 is located in the magnetic field between the pole shoes 5.2*a* and 5.2*b*, although at a working distance from the VOI, which is acting as a lens and, is fixed on a specimen holder there, which is not shown. The symmetry axis 5.5, about which the lens is rotationally symmetrical, extends through the two bores 5.6 and the volume of interest VOI.

The two pole shoes 5.1, as well as 5.2*a* and 5.2*b* are guided through flat, superconducting rings 5.3*a* and 5.3*b*, respectively, which are made from the high temperature superconductor YBCO. These rings can be mounted on a substrate, for example, as a thin layer. The superconducting rings are fastened on the supports (cooling fingers) 5.7*a* and 5.7*b*, which are made from copper, for example, and which are connected by thermal connections 5.8*a* and 5.8*b* to a non-illustrated cooling reservoir at the working temperature.

After the desired magnetic field in the VOI has been adjusted by means of the magnetic field source, the cooling fingers 5.7*a* and 5.7*b* are cooled by means of the thermally conductive connections 5.8a and 5.8b and then the cooling fingers cool the rings 5.3a and 5.3b to below their transition temperature. Henceforth, the magnetic field in the VOI remains constant, if the magnetic field strength is to be changed, the rings 5.3a and 5.3b can be briefly heated by means of heaters, at least locally, above the transition temperature and, therefore, can be made normal-conducting.

The conductor loops can be cooled separately, independently of the pole shoes of the electron microscope, which can remain at room temperature, by way of the thermally conductive connections 5.8a and 5.8b, to below their transition temperature and can be heated back to above the transition temperature by means of at least one heater. In an electron microscope, the pole shoes 5.2a and 5.2b as well as the arrangement consisting of the conductor loops 5.3a and 5.3b and the cooling fingers 5.7a and 5.7b are situated in a high vacuum, which acts as thermal insulation. By means of the additional thermal shields 5.9a and 5.9b, for example, a reflecting film, the conductor loops 5.3a and 5.3b and the cooling fingers 5.7a and 5.7b can be further thermally insulated with respect to the pole shoes 5.2a and 5.2b.

Figure 6:
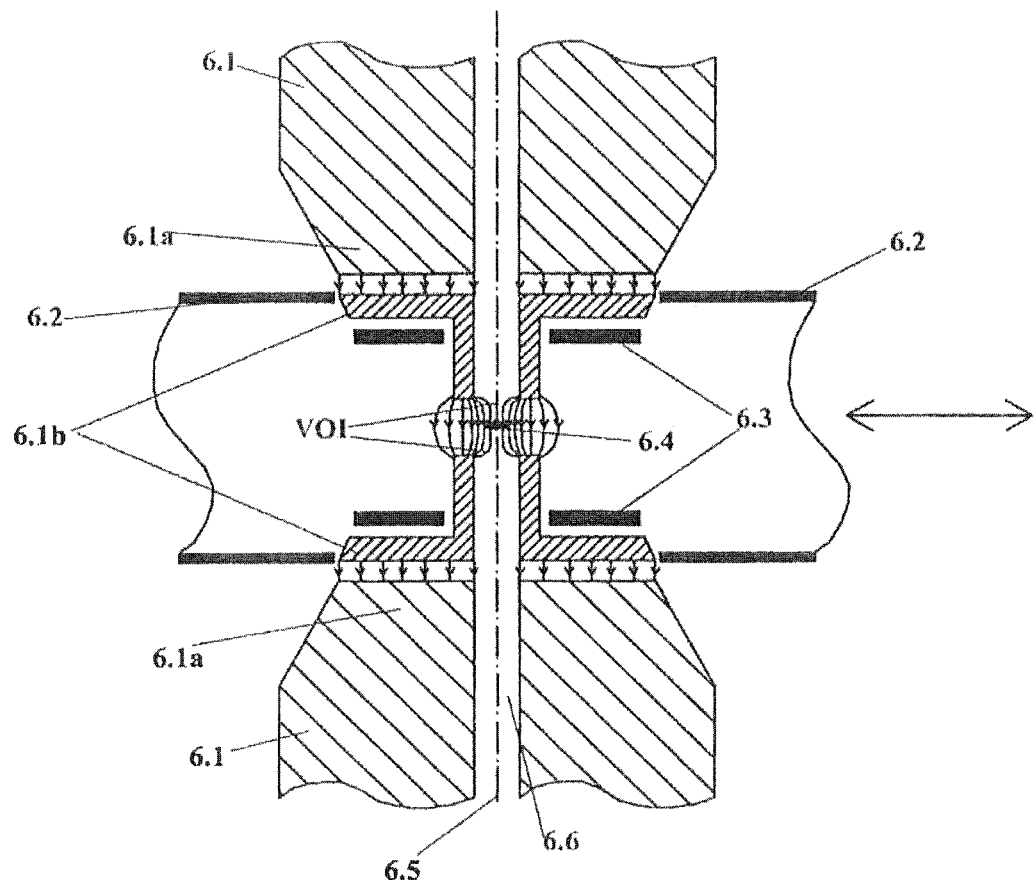
FIG. 6: shows a sectional drawing of a magnetic lens for a transmission electron microscope having a three-part, magnetically soft yoke and integration of the superconducting conductor loop into the specimen holder.

FIG. 6 shows a sectional drawing of a further lens for a transmission electron microscope as one exemplary embodiment of the device according to the invention. The magnetic field source is likewise not shown in FIG. 6, for the sake of clarity, (e.g., see magnetic field source 1.2 in FIG. 1, magnetic field source 2.2. in FIG. 2, magnetic field source 3.2a,b in FIG. 3, magnetic field source 4.2 in FIG. 4). The magnetically soft yoke 6.1 consists of a main body 6.1a and two concentrators 6.1b, which are designed as pole shoes. The main body 6.1a can comprise, for example, the pole shoes of an existing electron microscope. The concentrators 6.1b are disposed with respect to the main body 6.1a in such a way that planar surfaces are disposed opposite one another and the magnetic flux from the main body 6.1a can enter the concentrators 6.1b substantially loss-free. The volume of interest VOI is located at the point where the two concentrators 6.1b are situated most closely opposite one another. An inhomogenous magnetic field, which acts as a lens and in which the specimen 6.4 is located, prevails in this volume.

The concentrators are guided through superconducting rings 6.3 made from YBCO. The concentrators 6.1b and the conductor loops 6.3 are jointly integrated into a specimen holder 6.2 for the specimen 6.4, which can be cooled independently of the other components of the electron microscope. In this manner, the device can be particularly easily integrated into an otherwise unmodified electron microscope by inserting this specimen holder 6.2.

The lens is rotationally symmetrical with respect to the axis that extends through the volume of interest VOI in the direction of the main field. This axis 6.5 corresponds to the beam axis of the electron beam during operation of the electron microscope. Both the main body 6.1a and the concentrators 6.1b have bores 6.6, through which the electron beam can be guided.

The change as compared to the previous operation of the electron microscope is that the strongly curved field distribution acting on the electron beam as a lens no longer forms at the edges of the bore 6.6 through the main body 6.1a, but rather at the transition of the concentrators 6.1b to the VOI. The gap between the main body 6.1a and the concentrators 6.1b should be as small as possible, so that the magnetic flux passes over in an optimal manner. Some of the magnetic field lines are indicated by arrows.

Figure 7:
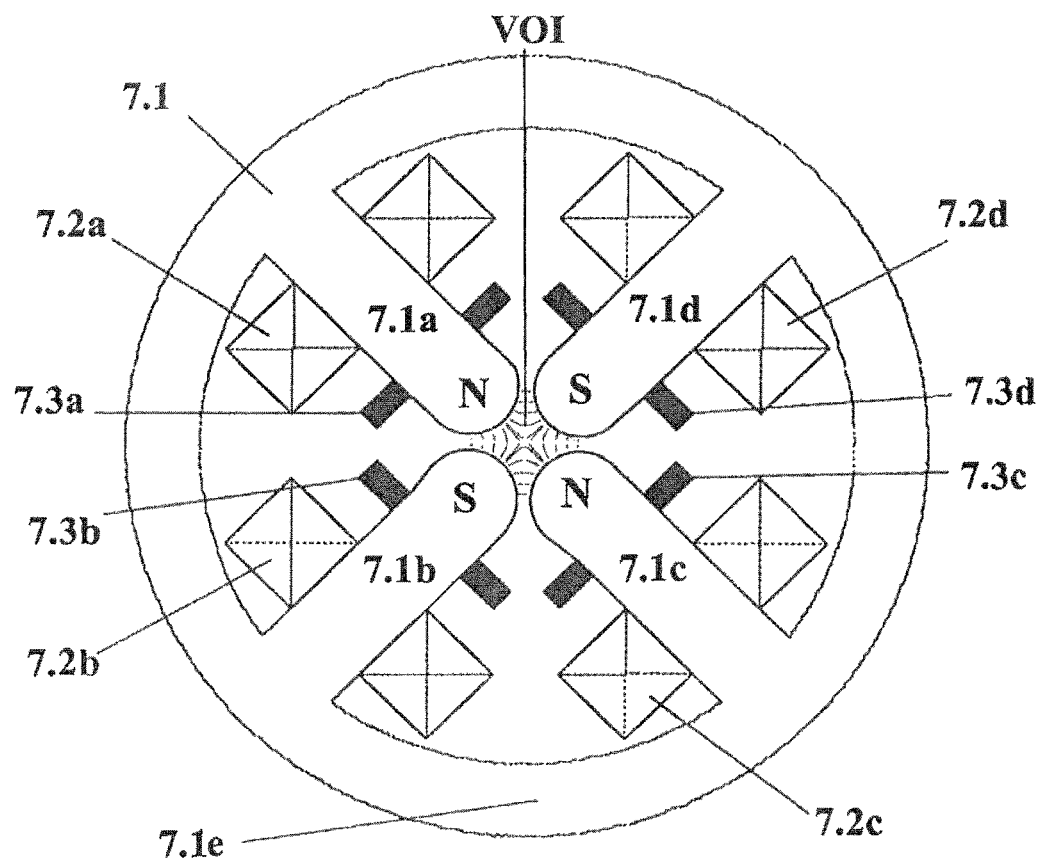
FIG. 7: shows a sectional drawing of a quadrupole magnet as one exemplary embodiment of the device according to the invention.

FIG. 7 shows a sectional drawing of a magnetic quadrapole lens for an electron microscope as one exemplary embodiment of the device according to the invention. Magnetic fluxes are coupled into the magnetically soft yoke 7.1 by four coils 7.2a, 7.2b, 7.2c and 7.2d. These magnetic fluxes are each guided by the four branches 7.1a, 7.1b, 7.1c and 7.1d of the yoke, which are guided through the coils 7.2a, 7.2b, 7.2c and 7.2d, respectively, into the center of the lens, where the volume of interest (VOI) is located between the ends of the four branches. A multipole field is applied to this volume. All four branches 7.1a, 7.1b, 7.1c and 7.1d of the yoke lead into a common outer ring 7.1e, which connects the branches to one another.

The four branches 7.1a, 7.1b, 7.1c and 7.1d of the yoke are each guided, on the way from the coils 7.2a, 7.2b, 7.2c and 7.2d, respectively, through superconducting rings 7.3a, 7.3b, 7.3c and 7.3d, respectively, which hold the flux constant in the superconducting state.

Analogously to the quadrapole arrangement in FIG. 7, greater multipoles, such as sextupoles or octupoles, can also be implemented.

Figure 8:
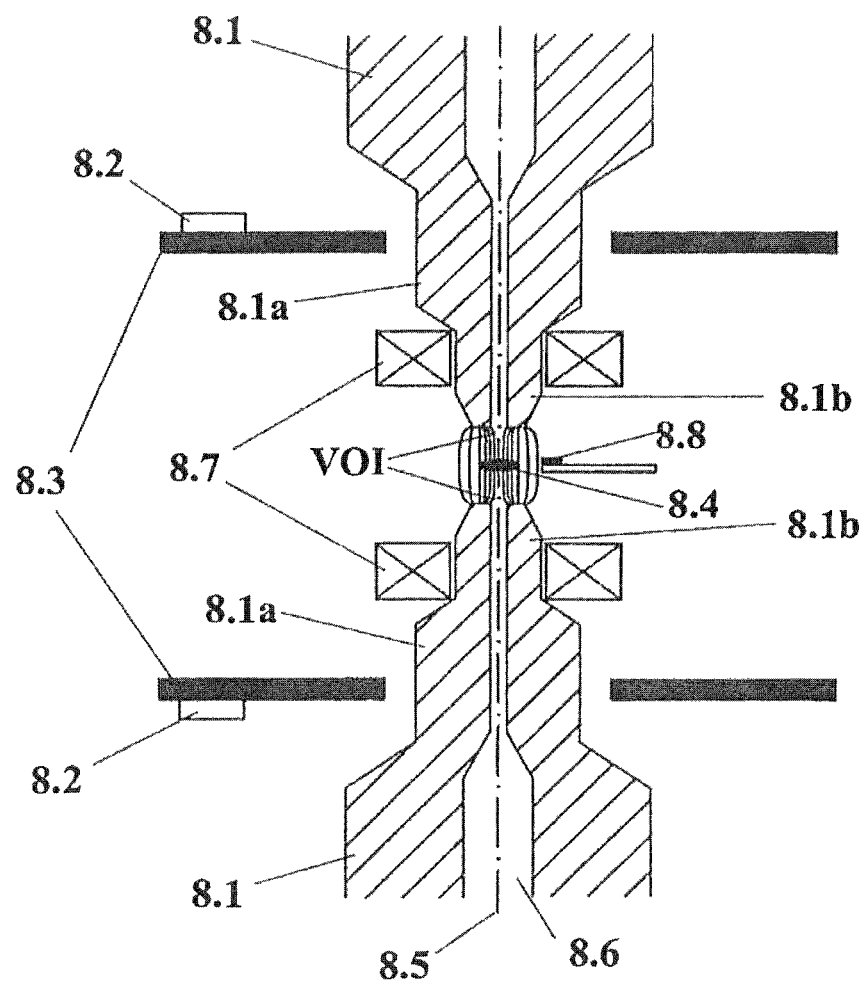
FIG. 8: shows a sectional drawing of a lens for a transmission electron microscope having a magnetic field detector and feedback coils, as one exemplary embodiment of the device according to the invention.

FIG. 8 shows a sectional drawing of a further lens for a transmission electron microscope as one exemplary embodiment of the device according to the invention. The magnetic field source is likewise not shown in FIG. 8, for the sake of clarity, (e.g., see magnetic field source 1.2 in FIG. 1, magnetic field source 2.2. in FIG. 2, magnetic field source 3.2a,b in FIG. 3, magnetic field source 4.2 in FIG. 4). The regions 8.1a, which are designed as pole shoes, protrude from the magnetically soft yoke 8.1, taper toward the regions 8.1b, and form a gap there.

The volume of interest VOI is located at the point where the pole shoes 8.1b are situated most closely opposite one another. An inhomogeneous magnetic field acting as a lens, in the vicinity of which the specimen 8.4 is located, prevails in this volume, in particular at the ends of the pole shoes 8.1b. The specimen 8.4 is mounted on a TEM specimen holder, which is not shown.

Each pole shoe 8.1a is guided through a superconducting ring 8.3 made from YBCO. The switching means 8.2 (e.g., Josephson contact and/or heating element and/or electromagnetic radiation source for local heating) is located on each superconducting conductor ring 8.3. A normal-conducting or superconducting correction coil 8.7 is disposed between this ring 8.3 and the VOI in each case. The two correction coils 8.7 together form a coil pair, which is disposed on an axis, and by means of which the magnetic flux in the VOI can also be changed, at least in a small range, with the rings 8.3 in the superconducting state. This magnetic flux acts in the VOI as a correction field, for example, for a focus adjustment in the electron microscope.

A magnetic field sensor 8.8 is disposed in the region of this correction field, although at the edge of or outside the VOI. With regard to the positioning of the magnetic field sensor, it is only important that the field strength at the location of the magnetic field sensor be proportional to the field strength in the VOI. The magnetic field sensor can be a Hall sensor, for example, or a flux transformer in combination with a shielded SQUID, to which the magnetic flux received by the flux transformer is transferred. The magnetic field sensor 8.8 can be switched into feedback with the correction coils 8.7 in order to hold the magnetic field in the VOI constant except for a fraction $10^{-6}$ of a flux quantum $\Phi_0$ (for example, for a SQUID having a flux transformer as the magnetic field sensor 8.8).

The lens is rotationally symmetrical with respect to the axis that extends through the volume of interest VOI in the direction of the main field. This axis 8.5 corresponds to the beam axis of the electron beam during operation of the electron microscope. The yoke 8.1 comprises bores 8.6, through which the electron beam can be guided.

Figure 9:
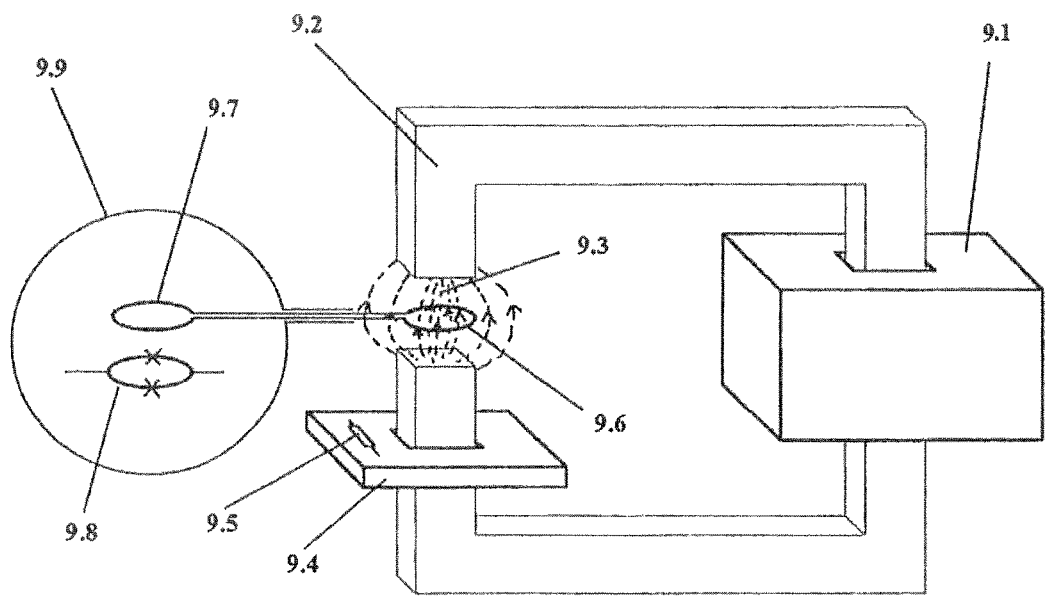
FIG. 9: shows an experimental set-up for a proof-of-concept measurement for demonstrating the basic principle.

FIG. 9 shows a perspective view of an experimental set-up for a proof-of-concept measurement, which illustrates the basic principle of the invention. The magnetically soft yoke 9.2 has a shape, which has been bent to form a rectangle. A magnetic flux is coupled into this yoke 9.2 by a coil 9.1 as the magnetic field source. The yoke 9.2 guides this flux into the volume of interest (VOI) 9.3 and applies a magnetic field to this volume VOI 9.3. Some of the field lines of this field are shown extending into the VOI, for purposes of illustration.

The strength of the magnetic field in the VOI 9.3 is determined by the magnetic flux through the yoke 9.2. The yoke 9.2 is surrounded by the superconducting conductor loop 9.4 in the vicinity of a pole shoe. After the magnetic field in the volume of interest VOI has been adjusted by means of the coil 9.1, this conductor loop 9.4 is cooled to below its transition temperature and, therefore, is switched to the superconducting state. Changes in the magnetic flux through the yoke 9.2 are henceforth compensated for by inducing a supercurrent along the conductor loop 9.4. A heating element 9.5 is located on the superconducting conductor loop. This makes if possible to switch the conductor loop back to the normal-conducting state, in order to implement a change in the magnetic field in the VOI 9.3 as necessary.

The magnetic field strength in the VOI is measured by a magnetic field sensor, which consists, for example, of a flux transformer having an in-coupling loop 9.6 and an out-coupling loop 9.7 and a SQUID 9.8. The SQUID and a part of the flux transformer are located in a magnetic shield 9.9 in this case. Leakage fields generated by the magnetic field source 9.1, which are not generated by the pole shoe ends at the gap, but rather act directly on the in-coupling loop 9.6, can result in interferences not being completely suppressed. Leakage fields, which emanate from parts of the yoke between the magnetic field source 9.1 and the superconducting ring 9.4, can likewise result in a diminished shielding of interferences. These effects can be minimized by means of suitable design measures, such as those discussed also with reference to FIG. 11, for example.

FIGS. 10(A) and 10(B) show the oscilloscope recordings of the proof-of-concept measurement. FIG. 10(A) shows the recording for when the conductor loop is in the superconducting state. FIG. 10(B) shows the recording for when the conductor loop is in the normal-conducting state. The measurement 10b shows the response of the SQUID detector to a sinusoidal fault signal (approximately 80 Hz), which was coupled in via the magnetic field-generating coil 9.1 while the heater 9.5 was switched on and the annular conductor loop 9.4 was therefore in the normal-conducting state. The measurement 10a shows the response of the SQUID to the same fault signal after the heater 9.5 was shut off. The error signal amplitude registered by the SQUID has decreased as compared to measurement 10b by a factor of 3.

In order to increase the effectiveness of the error signal suppression, it is advantageous to keep the distance between the magnetically soft pole shoe and the superconducting ring surrounding this pole shoe as small as possible. In addition, it is advantageous that the thickness of the superconducting ring be as great as possible and, specifically, the ring could consist of a solid superconductor or of a stack of thin-layer superconductor rings. This is illustrated in FIG. 11.

Figure 11A:
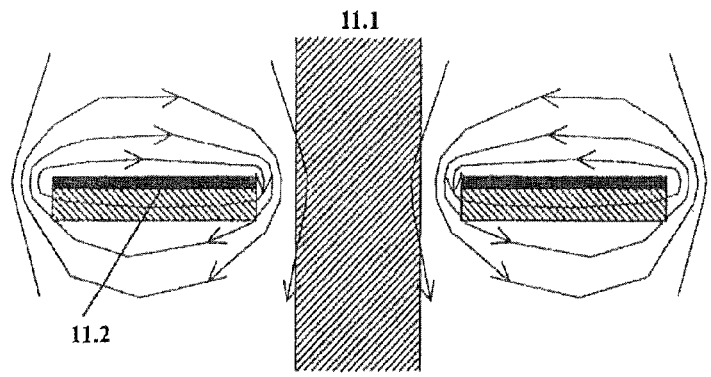
FIG. 11(A) shows the distribution of the magnetic field H between the superconducting conductor loop and the permalloy yoke in the case of a thin-layer conductor loop.
Figures 11B, 11C:
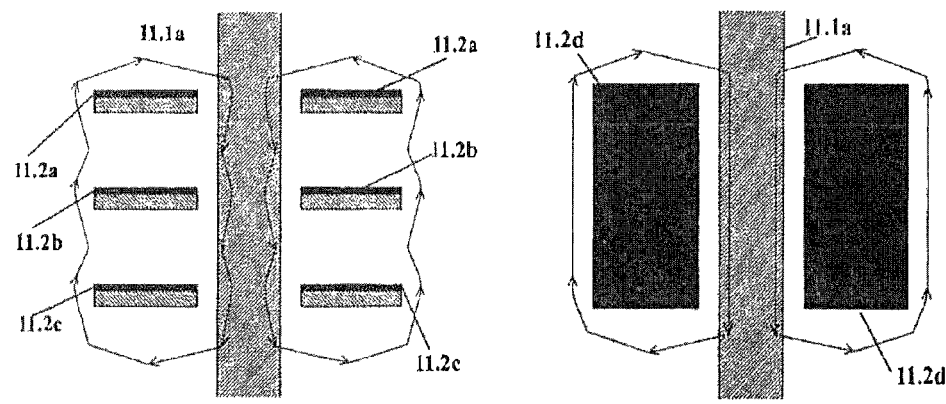
FIG. 11(B): shows the distribution of the magnetic field H between the superconducting conductor loop and the permalloy yoke in the case of multiple thin-layer conductor
FIG. 11(C): shows the distribution of the magnetic field H between the superconducting conductor loop and the permalloy yoke in the case of a solid conductor loop.

FIGS. 11(A)-11(D) show the distribution of the magnetic field H between the superconducting conductor loop and the permalloy yoke in the case of: a) a thin-layer conductor loop, b) multiple thin-layer conductor loops, c) a solid conductor loop, or d) a bulge in the yoke. In FIGS. 11(A), 11(B) and 11(C) the conductor loop is a thin layer (shown in black) on a normal-conducting or insulating substrate (shown with shading).

The greater the distance between the conductor loop and the yoke is, the greater the portion of the magnetic field is that is generated by the conductor loop and extends through the gap. The flux belonging to this portion does not contribute anything to the compensation of flux changes in the yoke 11.1. At the same time, at the edges of the conductor loop 11.2, the local magnetic field is that much larger, the thinner the conductor loop is. As a result, the portion of the magnetic flux of the conductor loop that extends through the gap increases. The compensation of flux changes in the yoke 11.1 is therefore further degraded (FIG. 11(A), In the case of a very strong local field increase at the edge of the conductor loop 11.2, the flux in the gap can make up a significant portion of the total flux passing through the conductor loop (up to approximately ⅓) despite the fact that the relative permeability μr of the yoke is substantially higher than that of the vacuum in the gap.

FIG. 11(B) shows that this problem is substantially ameliorated by way of the magnetic field emanating from the conductor loops 11.2a, 11.2b and 11.2c being homogenized in the interior of the stack formed by these conductor loops by arranging multiple conductor loops at a distance that corresponds to at most the width of the conductor loop. In terms of energy, it can be favorable for the flux to enter the yoke 11.1a early and extend along the stack within the yoke 11.1a, where the magnetic resistance is small due to the high relative permeability μr.

FIG. 11(C) shows an alternative way to avoid high fluxes in the gap. In this case, the field in the region surrounded by the conductor loop 11.2d is homogenized by way of this conductor loop being substantially thicker than it is wide along the course of the yoke 11.1a.

Figure 11D:
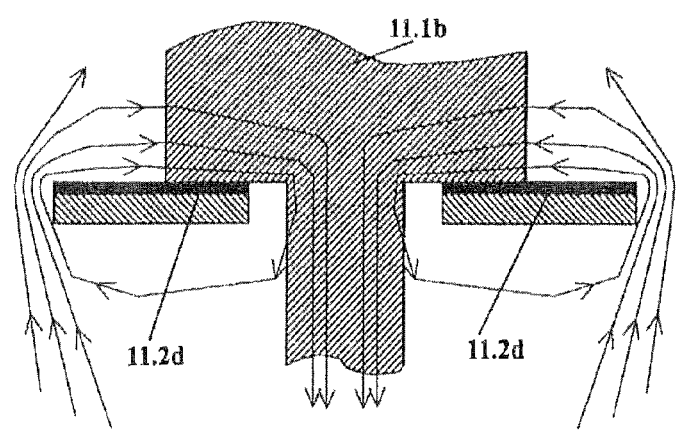
FIG. 11(D): shows the distribution of the magnetic field H between the superconducting conductor loop and the permalloy yoke in the case of the superconducting loop in physical contact with a bulge of the yoke.

FIG. 11(D) shows how a yoke 11.1b having a bulge prevents high fluxes in the gap. The bulge rests on the area defined by the course of the conductor loop 11.2d in space. As a result, a considerable portion of the magnetic flux, which is generated by the conductor loop 11.2d and extends along the surface of the conductor loop, is captured by the yoke 11.1b before entering the gap.

The invention claimed is:

1. A device for applying a constant magnetic field to a volume of interest (VOI), comprising:
    a magnetic field source;
    a permeable yoke, which guides a magnetic flux generated by the magnetic field source into the volume of interest (VOI); and
    a conductor loop through which the yoke extends, the conductor loop being a closed conductor loop and having at least a first state which is a superconducting state and a second state which is not a superconducting state; and
    wherein in response to a change in flux through the yoke while the conductor loop is in the superconducting state, a current is induced in the conductor loop which effects a counteracting of said change in flux.

2. The device according to claim 1, wherein the conductor loop is disposed along the yoke between the volume of interest and a location at which interference is impressed upon the flux through the yoke.

3. The device according to claim 1, wherein the conductor loop is disposed between the magnetic field source and the volume of interest (VOI).

4. The device according to claim 1, wherein the conductor loop is disposed in the region of any transition between the volume of interest (VOI) and the yoke.

5. The device according to claim 1, wherein the conductor loop is disposed at a location away from the magnetic field source where field strength of a magnetic field emanating from the magnetic field source is at most one-tenth a maximum field strength of the emanating magnetic field.

6. The device according to claim 1, wherein the yoke is guided through at least one conductor loop on every path leading from a magnetic field source to the volume of interest (VOI).

7. The device according to claim 1, wherein the conductor loop is disposed at a location along the yoke at which the leakage field strength emanating from the yoke is at most one-fifth of a maximum field strength of the magnetic field in the volume of interest (VOI).

8. The device according to claim 1, wherein the material of the yoke has a relative permeability $\mu_r$ of at least 10.

9. The device according to claim 1, further comprising means for switching the conductor loop between the first state and the second state, said switching means located at said conductor loop.

10. The device according to claim 9, wherein the switching means comprises at least one device from among the following group of devices:
a Josephson junction contact;
a heating element; and
an electromagnetic radiation source for heating the conductor loop.

11. The device according to claim 9, wherein a first portion of the conductor loop has a smaller cross-sectional area than a cross-sectional area of another portion of the conductor loop, the first portion having a reduced critical current at a periphery relative to a critical current elsewhere along the periphery of the current loop, so that the first portion serves a flux dam to magnetic flux along the periphery of the current loop during a transition to the second state.

12. The device according to claim 1, wherein the conductor loop is implemented as a layer on a substrate.

13. The device as claimed in claim 1, wherein the magnetic field source, the yoke, and the conductor loop are designed with rotational symmetry about an axis that passes through the volume of interest (VOI).

14. The device as claimed in claim 1, wherein the conductor loop consists of a high temperature superconducting material.

15. The device as claimed in claim 1, further comprising:
a correction coil, to which a current is applied separately, disposed along the yoke between the closed conductor loop and the volume of interest.

16. The device as claimed in claim 15, further comprising a feedback loop and means for measuring a magnetic field strength emanating from the correction coil, wherein the feedback loop receives the measured magnetic field strength as an input and regulates the current through the correction coil.

17. The device as claimed in claim 1, comprising a plurality of said conductor loops, wherein the yoke is guided through said plurality of conductor loops, wherein the plurality of conductor loops are disposed along the yoke at a spacing that corresponds at most to a cross-sectional width of one of the conductor loops.

18. The device as claimed in claim 17, wherein the spacing is at least as great as a shortest distance between the plurality of conductor loops and the yoke.

19. The device as claimed in claim 1, wherein the conductor loop is at least as thick as it is wide.

20. The device according to claim 1, wherein the yoke has a bulge, which:
rests on the area defined by the course of the conductor loop in space; and/or
is separated from this area by a gap, wherein the bulge extends into the region in which the magnetic field generated by the conductor loop has at least 50% of its maximum strength on the area.

21. The device according to claim 1 configured as any of the following:
a magnetic lens in an electron microscope;
a device for stabilizing the magnetic field of the magnetic field source, in which the magnetic field is applied to a specimen during a measurement of nuclear magnetic resonance (NMR);
a device for stabilizing the magnetic field of the magnetic field source in a particle trap; or
a device for stabilizing the magnetic field in a particle accelerator, in which the magnetic field source is a beam guiding or detector magnet.

22. A method for operating a device according to claim 1, comprising:
adjusting the flux through the yoke by means of the magnetic field source while the conductor loop is in the normal-conducting state, and
subsequently switching the conductor loop to the superconducting state, in order to hold the flux constant.

23. The method for operating a device according claim 1, comprising:
adjusting the flux through the yoke by means of the magnetic field source while the conductor loop is in the superconducting state, and therefore the change in flux is converted into a supercurrent through the conductor loop;
subsequently switching the conductor loop to the normal-conducting state at least at one point, in order to convert the supercurrent into a change in the magnetic field in the volume of interest (VOI); and
subsequently returning the conductor loop to the superconducting state, in order to hold the magnetic field in the volume of interest (VOI) constant at the new level.

24. The device as claimed in claim 1, wherein at least one conductor loop consists of a high temperature superconducting material based on YBCO.

25. The device according to claim 1, wherein the conductor loop is disposed at a location away from the magnetic field source where field strength of a magnetic field emanating from the magnetic field source is at most one one-hundredth a maximum field strength of the emanating magnetic field.

26. The device according to claim 1, wherein the conductor loop is disposed at a location away from the magnetic field source where field strength of a magnetic field emanating from the magnetic field source is at most one one-thousandth a maximum field strength of the emanating magnetic field.

27. The device according to claim 1, wherein the conductor loop is disposed at a location along the yoke at which a leakage field strength emanating from the yoke is at most one-tenth of a maximum field strength of the magnetic field in the volume of interest (VOI).

28. The device according to claim 1, wherein the conductor loop is disposed at a location along the yoke at which a leakage field strength emanating from the yoke is at most one one-hundredth of a maximum field strength of the magnetic field in the volume of interest (VOI).

29. The device according to claim 1, wherein the material of the yoke has a relative permeability $\mu_r$ of at least 100.

* * * * *